(12) United States Patent
Biber et al.

(10) Patent No.: US 11,714,150 B2
(45) Date of Patent: Aug. 1, 2023

(54) NON-CYLINDRICAL GRADIENT COIL UNIT

(71) Applicant: Siemens Healthcare GmbH, Erlangen (DE)

(72) Inventors: Stephan Biber, Erlangen (DE); Andreas Krug, Fürth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/704,918

(22) Filed: Mar. 25, 2022

(65) Prior Publication Data

US 2022/0308138 A1 Sep. 29, 2022

(30) Foreign Application Priority Data

Mar. 25, 2021 (DE) .................. 10 2021 202 956.6

(51) Int. Cl.
*G01R 33/38* (2006.01)
*G01R 33/385* (2006.01)

(52) U.S. Cl.
CPC .................................. *G01R 33/385* (2013.01)

(58) Field of Classification Search
CPC .................................................. G01R 33/385
See application file for complete search history.

(56) References Cited

U.S. PATENT DOCUMENTS 5,574,373 A * 11/1996 Pausch ................. G01R 33/385
324/318
5,939,882 A * 8/1999 Gebhardt ............. G01R 33/385
324/318

FOREIGN PATENT DOCUMENTS

DE 19653449 A1 6/1998

OTHER PUBLICATIONS

Vegh et al: "The Design of Planar Gradient Coils. Part I: A Winding Path Correction Method" in: Concepts in Magnetic Resonance Part B: Magnetic Resonance Engineering, 27(1): 17-24 in Oct. 2005.
(Continued)

*Primary Examiner* — G. M. A Hyder
(74) *Attorney, Agent, or Firm* — Banner & Witcoff Ltd.

(57) ABSTRACT

A gradient coil unit including a first conductor structure arranged within a first form and a second conductor structure arranged within a second form, wherein the first conductor structure and the second conductor structure are designed together to generate a magnetic field gradient in a first direction, the first form and the second form are arranged separately, opposite each other, and divided by a hollow space, and the first form has a segment of a circle as a cross section.

12 Claims, 5 Drawing Sheets

(56) References Cited

OTHER PUBLICATIONS

Vegh et al: "The design of planar gradient coils. Part II: A weighted superposition method" Concepts in Magnetic Resonance Part B (Magnetic Resonance Engineering), vol. 27B(1) 25-33, Oct. 2005.
Henning, Juergen et al. "Parallel imaging in non-bijective, curvilinear magnetic field gradients: a concept study" Magnetic Resonance Materials in Physics, Biology and Medicine, vol. 21, pp. 5-14, 2008 // DOI: 10.1007/s10334-008-0105-7.
Schultz G. et al: "Image Reconstruction in K-Space from MR Data Encoded with Ambiguous Gradient Fields", PatLoc Imaging: Reconstruction in K-space, Magn Reson Med. Feb. 2015:73(2):859-864.
Littin, Sebastian et al: "Development and implementation of an 84-channel matrix gradient coil: Matrix Gradient Coil"; Magnetic Resonance in Medicine, vol. 79; No. 2, Feb. 1, 2018, pp. 1181-1191, XP055698293, US; ISSN: 0740-3194, DOI: 10.1002/mrm.26700; 2018.

\* cited by examiner

NON-CYLINDRICAL GRADIENT COIL UNIT

FIELD OF THE DISCLOSURE

The disclosure relates to a non-cylindrical gradient coil unit which is designed to fit into a hollow cylindrical magnet unit of a magnetic resonance device, and a magnetic resonance device comprising such a non-cylindrical gradient coil unit.

BACKGROUND

In a magnetic resonance device, the body of an examination object that is to be examined, in particular a patient, is exposed to a relatively high main magnetic field, for example 1.5 or 3 or 7 tesla, by means of a magnet unit. In addition, gradient pulses are emitted by means of a gradient coil unit. Radio-frequency pulses, for example excitation pulses, are then emitted at high frequency by means of suitable antenna equipment via a radio-frequency antenna unit, whereby the nuclear spins of specific atoms which are resonantly excited by these radio-frequency pulses are tilted by a defined flip angle relative to the magnetic field lines of the main magnetic field. The relaxation of the nuclear spins gives rise to the emission of radio-frequency signals, so-called magnetic resonance signals, which are received and then further processed by means of suitable radio-frequency antennas. The desired image data can subsequently be reconstructed from the raw data acquired thus. A gradient coil unit is typically configured to generate a magnetic field gradient in at least one spatial direction. The magnet unit and the gradient coil unit are typically of hollow cylindrical design in each case and the gradient coil unit is arranged within the hollow space of the magnet unit. The patient receiving region, in which the examination object is supported while the magnetic resonance signals are received, is typically situated within the gradient coil unit. It is known that a larger patient receiving region is associated with greater comfort for the examination object and with higher production costs for the magnetic resonance device.

SUMMARY

An object of the disclosure is to specify a gradient coil unit and a magnetic resonance device which economically allow a high degree of comfort for the examination object.

The gradient coil unit according to the disclosure is designed to fit into a hollow cylindrical magnet unit having an internal radius and a magnet length along the cylinder axis of a magnetic resonance device. The gradient coil unit according to the disclosure comprises a first conductor structure arranged within a first form and a second conductor structure arranged within a second form, wherein the first conductor structure and the second conductor structure are designed together to generate a magnetic field gradient in a first direction, the first form and the second form are arranged separately, opposite each other, and divided by a hollow space, and the first form has a segment of a circle as a cross section perpendicular to the cylinder axis.

A conductor structure, in particular the first conductor structure and/or the second conductor structure, typically comprises an electrical conductor. The geometric arrangement of an electrical conductor can be referred to as a conductor structure.

The first conductor structure is designed together with the second conductor structure for the purpose of generating a magnetic field gradient in the first direction. The first direction is typically a spatial direction, preferably parallel and/or perpendicular to the cylinder axis of the magnetic resonance device and/or horizontal and/or vertical. The activation of the first conductor structure and the second conductor structure is typically effected by applying an electrical current in the first conductor structure and the second conductor structure. An electrical conductor typically connects the first conductor structure to the second conductor structure. The first conductor structure and the second conductor structure can be interconnected in series, in particular using the electrical conductor. The first conductor structure and the second conductor structure can also be connected together in parallel. The activation of a conductor structure comprised by the gradient coil unit, in particular the first conductor structure and the second conductor structure, for the purpose of generating a magnetic field gradient, is typically effected by applying an electrical current in this conductor structure. The conductor structure typically comprises copper and/or aluminum and/or other low-resistance material.

The first conductor structure is typically surrounded and/or enclosed by the first form. The first conductor structure can be embedded and/or cast into the first form. The first conductor structure is typically held in place spatially by the first form. The first form can comprise resin and/or plastic and/or at least fiber reinforcement. The second conductor structure is typically surrounded and/or enclosed by the second form. The second conductor structure can be embedded and/or cast into the second form. The second conductor structure is typically held in place spatially by the second form. The second form can comprise resin and/or plastic and/or at least fiber reinforcement. The first conductor structure and/or the second conductor structure can be designed in the shape of a spiral and/or a saddle and/or as segment coils. The first conductor structure and the second conductor structure are preferably designed together to generate a linear magnetic field gradient in the first direction. The first conductor structure and the second conductor structure can also be designed together to generate a non-linear and/or ambiguous magnetic field gradient, referred to in the specialist literature as PatLoc and/or FlatLoc. The first conductor structure and the second conductor structure together typically form a primary coil. For the purpose of screening a magnetic field gradient generated by the first conductor structure and the second conductor structure outside the patient receiving region, in particular outside the hollow space, the gradient coil unit preferably comprises a secondary coil, which can comprise a secondary first conductor structure and a secondary second conductor structure. The secondary first conductor structure and the secondary second conductor structure can be arranged radially outside the first conductor structure and the second conductor structure.

The first form and the second form are separate and preferably do not spatially overlap therefore. At least the first form has a segment of a circle as a cross section perpendicular to the cylinder axis, preferably in a plane defined by a vertical and a horizontal. The contour of the segment of a circle typically comprises an arc and a chord. The radius defining the arc is typically no more than 20% smaller, preferably no more than 10%, most preferably no more than 5% smaller than the internal radius of the hollow cylindrical magnet unit. The chord typically defines that side of the first form which faces towards the examination object. The arc typically defines that side of the first form which faces towards the magnet unit. The first form and the second form are typically designed to fit within the hollow cylindrical magnet unit, in particular in the hollow region thereof. The hollow space between the first form and the second form typically comprises the examination region and is configured to at least partially receive an examination object. The cylinder axis typically runs through the hollow space and/or is located outside the first form and/or the second form.

In comparison with conventional gradient coil units in the shape of a hollow cylinder, the non-cylindrical gradient coil unit according to the disclosure requires little space and/or is formed in such a way that the hollow cylindrical region of the magnet unit is used by the first form and the second form at those positions where the comfort of the examination object is compromised only slightly. In particular, the positions can be adapted by the first form and the second form to the anatomy of the examination object. This increases the comfort of the examination object in an economical manner while the internal radius of the magnet unit remains unchanged. Equally, the internal radius of the magnet unit can be reduced for the same level of comfort for the examination object, whereby the magnet unit and therefore the magnetic resonance device likewise can be manufactured more economically.

One aspect of the gradient coil unit provides that a contour of a cross section of the second form perpendicular to the cylinder axis includes an arc which has the internal radius. The second form has a segment of a circle as a cross section perpendicular to the cylinder axis, preferably in a plane defined by a vertical and a horizontal. The contour of the segment of a circle typically comprises an arc and a chord. The radius defining the arc is typically no more than 20% smaller, preferably no more than 10%, most preferably no more than 5% smaller than the internal radius of the hollow cylindrical magnet unit. The chord typically defines that side of the second form which faces towards the examination object. The arc typically defines that side of the second form which faces towards the magnet. Such a gradient coil unit, in particular when the first form and the second form are arranged opposite each other in accordance with the disclosure and divided by a hollow space, allows a particularly good adaptation to the anatomy of the examination object, particularly if the examination region includes the torso.

One aspect of the gradient coil unit provides that a chord of the first form is oriented horizontally and the first form is arranged below the second form. The first form is preferably arranged below the cylinder axis and the second form above the cylinder axis. According to this aspect, the examination object can be arranged lying on the flat side of the first form, the second form being arranged above the examination object. This non-cylindrical gradient coil unit therefore provides a hollow space whose horizontal extent perpendicular to the cylinder axis is greater than its vertical extent. This hollow space is particularly good and comfortable for an examination region which includes the torso or extremities.

One aspect of the gradient coil unit provides that the second form has a segment of a circle as a cross section perpendicular to the cylinder axis, with a chord in a horizontal direction. This non-cylindrical gradient coil unit therefore provides a hollow space which is delimited above and below by two horizontal planes and is delimited on the sides by the internal radius of the magnet unit. This hollow space is particularly good and comfortable for an examination region comprising the torso or extremities.

One aspect of the gradient coil unit provides that the first form has a larger sagitta perpendicular to the cylinder axis than the second form. The first sagitta of the first form is typically larger by at least 10%, preferably by at least 20%, most preferably by at least 30% than the second sagitta of the second form. The horizontal plane defined by the first form parallel to the cylinder axis therefore has a smaller distance from the cylinder axis than the horizontal plane of the second form. The horizontal plane defined by the first form parallel to the cylinder axis becomes larger as the first sagitta increases, provided the first sagitta is smaller than the internal radius. The horizontal plane defined by the first form parallel to the cylinder axis can define the receiving surface for the examination object. The larger the receiving surface, the greater the comfort for the examination object. This aspect therefore allows a particularly high degree of comfort.

One aspect of the gradient coil unit provides that the second form has a crescent-shaped cross section perpendicular to the cylinder axis. The crescent-shaped cross section typically has an outer arc and an inner arc. The radius defining the outer arc is typically no more than 20% smaller, preferably no more than 10%, most preferably no more than 5% smaller than the internal radius of the hollow cylindrical magnet unit. The radius defining the inner arc is typically at least 5%, preferably at least 10%, most preferably at least 15% larger than the internal radius of the hollow cylindrical magnet unit. The inner arc can also be described by an ellipse with a horizontal main axis. Such a gradient coil unit allows comfortable positioning of the examination object on a horizontal plane which is defined by the first form and a large hollow space which is defined by the internal radius, in particular in a horizontal direction, and can therefore be maximized for a defined magnet unit. The crescent shape makes it possible to maximize the height of the hollow space and therefore the examination region in the vertical, which can help in particular to counter claustrophobia.

One aspect of the gradient coil unit provides that a chord of the first form is oriented vertically and the second form has a segment of a circle as a cross section perpendicular to the cylinder axis, with a chord in a vertical direction. This aspect is particularly suitable if the spatial extent of the examination region and/or the examination object surrounding the examination region is not smaller in a vertical direction than in a horizontal direction. In particular, this aspect is advantageous if the examination region includes the head and/or excludes the shoulder region and/or the torso. The gradient coil unit reduces the internal radius of the magnet unit laterally, in particular at the ears of the head of the examination object, while the hollow space and therefore the field of view in a vertical direction, i.e. the upward field of view of the examination object, is not restricted. This allows the geometry of the gradient coil unit to be ideally adapted to the shape of a head, whereby comfortable measurement of the examination object can still be achieved when a small internal radius of the magnet unit is used, for example 25 cm. In particular, this aspect allows an unobstructed view of a display screen which is positioned in front of the examination object and allows comfortable entertainment and/or studies within the environment of the MR imaging function. The examination region according to this aspect is typically between 10 cm×10 cm×10 cm and 25 cm×25 cm×25 cm.

One aspect of the gradient coil unit provides that the first form parallel to the cylinder axis has a longer upper edge than lower edge. The second form parallel to the cylinder axis preferably has a longer upper edge than lower edge.

In a prone position, the shoulder region of the examination object has a larger horizontal extent and smaller vertical extent than the neck and/or the head. If the first form and/or the second form is shorter in the lower region, i.e. the shoulder region, than in the upper region, particularly good adaptation to the anatomy is possible. In particular, this increases the comfort while nonetheless achieving a good spatial covering of the head. The upper edge and the lower edge of the first form and/or the second form are preferably flush at the peripheral end of the gradient coil unit, i.e. at the end which faces away from the examination object.

One aspect of the gradient coil unit provides that a projection of the first form and/or the second form in a plane parallel to the cylinder axis is a trapezoid. The projection of the first form and/or the second form in a plane parallel to the cylinder axis is preferably a right-angled trapezoid, the upper edge and the lower edge of the first form and/or the second form preferably being flush at the peripheral end. This aspect can be realized particularly easily and economically.

One aspect of the gradient coil unit provides that a projection of the first form and/or the second form in a plane parallel to the cylinder axis has a curvature on at least one side between upper edge and lower edge. The upper edge and the lower edge of the first form and/or the second form are preferably flush at the peripheral end. The first form and/or the second form can therefore be adapted particularly well to the torso and/or the shoulder region.

One aspect of the gradient coil unit comprises a third conductor structure arranged within a third form, wherein the first conductor structure, the second conductor structure and the third conductor structure are designed together to generate a magnetic field gradient in a first direction and the third form has a segment of a circle as a cross section perpendicular to the cylinder axis, with a chord in a horizontal direction.

The third conductor structure is typically surrounded and/or enclosed by the third form. The third conductor structure can be embedded and/or cast into the third form. The third conductor structure is typically held in place spatially by the third form. The third form can comprise resin and/or plastic and/or at least fiber reinforcement.

The third conductor structure can be designed in the shape of a spiral and/or a saddle and/or as a segment coil. The first conductor structure, the second conductor structure and the third conductor structure are preferably designed together to generate a linear magnetic field gradient in the first direction. The first conductor structure, the second conductor structure and the third conductor structure can also be designed together to generate a non-linear and/or ambiguous magnetic field gradient, referred to in the specialist literature as PatLoc and/or FlatLoc.

The first form and the third form are preferably arranged in such a way that their chords intersect at right angles. The first form and the third form can intersect. The second form and the third form are preferably arranged in such a way that their chords intersect at right angles. The second form and the third form can intersect. The first form, the second form and the third form preferably surround the examination region from three sides. The examination object is preferably positioned on the horizontal plane of the third form and/or parallel thereto. The first form, the second form and the third form can be separate from each other. The first form, the second form and the third form can together form a unit which is in particular free of sectional surfaces. The first conductor structure, the second conductor structure and the third conductor structure can be encapsulated together, preferably by means of an encapsulating material such as resin, for example. The first form, the second form and the third form can then constitute a combined form enclosing the first conductor structure, the second conductor structure and the third conductor structure.

This aspect allows an unobstructed field of view and good utilization of the hollow space below a prone examination object for the third conductor structure. It is thereby possible to generate a particularly precise magnetic field gradient while at the same time providing maximum comfort for the examination object.

One aspect of the gradient coil unit provides that the spatial extent of the first form and/or the second form parallel to the cylinder axis is shorter than the magnet length. This allows a compact implementation and simple installation. In particular, the hollow region is occupied to the smallest possible extent by the gradient coil unit.

One aspect of the gradient coil unit provides that the gradient coil unit is axially symmetrical relative to a vertical which includes the cylinder axis. This symmetry reflects the symmetry of the examination object. Moreover, a symmetrical gradient coil unit is particularly easy to design and manufacture. The gradient coil unit can also be axially symmetrical relative to a horizontal which includes the cylinder axis, i.e. it can also be point-symmetrical relative to the cylinder axis. In particular, a symmetrical relationship between the first form and the second form make the gradient coil unit particularly robust.

One aspect of the gradient coil unit comprises an electrical conductor and a connection unit connecting the first conductor structure to the second conductor structure and to a gradient amplifier unit, said connection unit being arranged outside the hollow space at the peripheral end of the magnet unit. This allows very simple combined activation of the first conductor structure and the second conductor structure, in particular using a conventional gradient amplifier unit, without the hollow space being restricted by the electrical conductor or the connection unit. The gradient coil unit can also comprise a further gradient amplifier unit. The gradient amplifier unit can be connected to the first conductor structure and/or the further gradient amplifier unit can be connected to the second conductor structure and/or the first conductor structure and the second conductor structure can also be connected together in parallel.

The disclosure also relates to a magnetic resonance device comprising a hollow cylindrical magnet unit having an internal radius and a magnet length along the cylinder axis and a gradient coil unit according to the disclosure, said gradient coil unit being arranged within the internal radius of the magnet unit. The magnetic resonance device preferably comprises a radio-frequency antenna unit for transmitting and receiving radio-frequency signals and in particular magnetic resonance signals. Such a radio-frequency antenna unit can be integrated in the gradient coil unit. Such a radio-frequency antenna unit can be configured separately from the gradient coil unit, in particular as a local combined transmit/receive coil. The radio-frequency antenna unit preferably encloses the examination region of the examination object at a distance of no more than 20 cm from the examination object, most preferably no more than 7 cm. Aspects of the magnetic resonance device according to the disclosure are designed in a similar manner to the aspects of the gradient coil unit according to the disclosure. The magnetic resonance device may comprise further components that are necessary and/or advantageous for the integration of the gradient coil unit.

The advantages of the magnetic resonance device according to the disclosure correspond substantially to the advantages of the gradient coil unit according to the disclosure as explained in detail above. Features, advantages or alternative aspects cited in this context can be applied likewise to the other claimed subject matter and vice versa.

BRIEF DESCRIPTION OF THE DRAWINGS

Further advantages, features and details of the disclosure are evident from the exemplary aspects described in the following and with reference to the drawings, in which.

DETAILED DESCRIPTION

Figure 1:
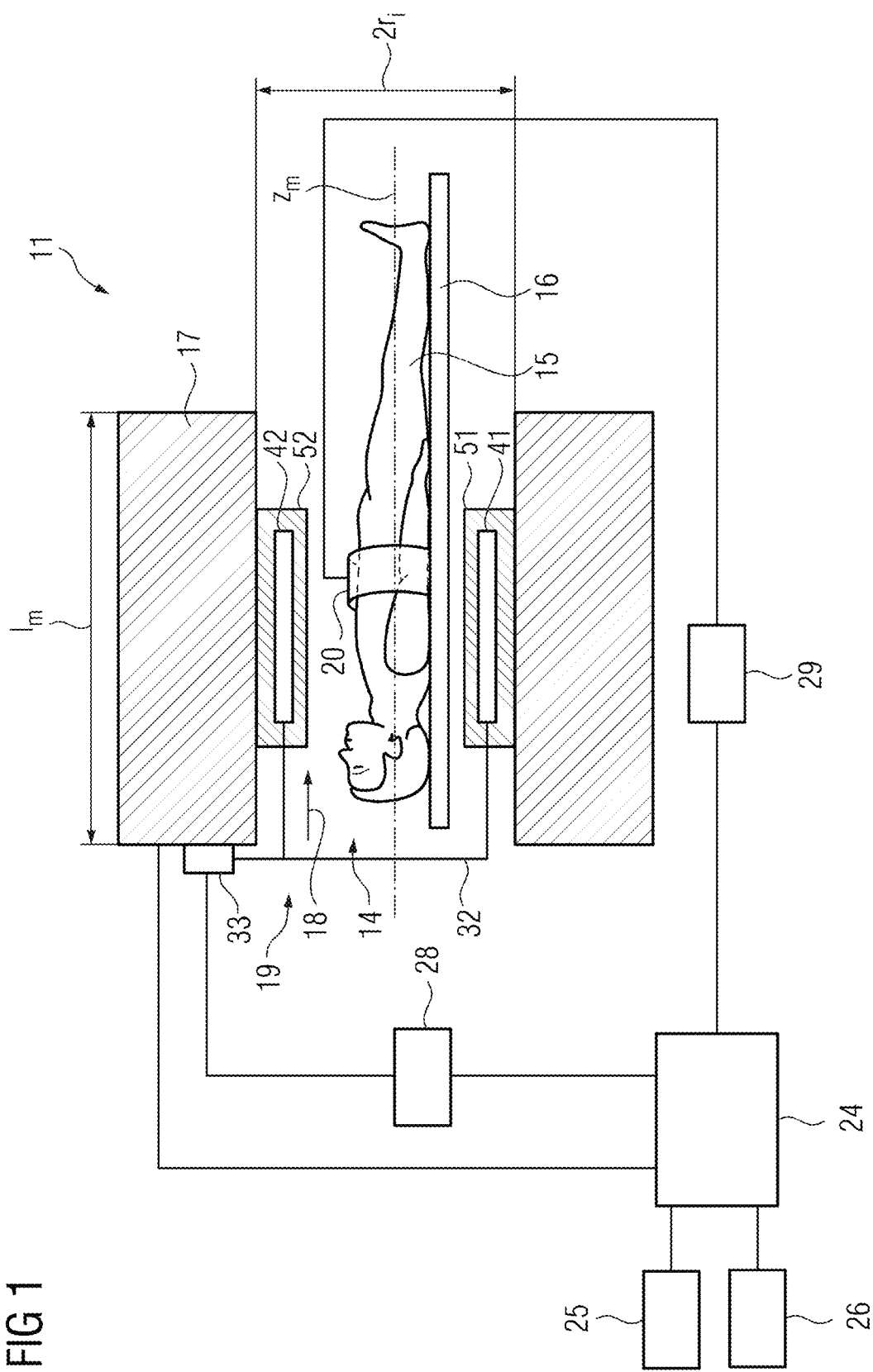
FIG. 1 shows a first aspect of a magnetic resonance device according to the disclosure in a schematic illustration in a first view.

FIG. 1 shows a magnetic resonance device 11 according to the disclosure in a schematic illustration. The magnetic resonance device 11 comprises a magnet unit 17 for generating a strong and in particular constant main magnetic field 18. The magnet unit 17 is of hollow cylindrical design with an internal radius ri and a magnet length lm along the cylinder axis zm of the magnetic resonance device 11. The magnetic resonance device 11 also has a gradient coil unit 19 which is used for spatial encoding during imaging. The gradient coil unit 19 fits into the region having the internal radius ri that is surrounded by the hollow cylinder of the magnet unit 17.

The gradient coil unit 19 comprises a first conductor structure 41 arranged within a first form 51 and a second conductor structure 42 arranged within a second form 52, the first conductor structure 41 and the second conductor structure 42 being designed together to generate a magnetic field gradient in a first direction. The first form 51 and the second form 52 are arranged separately, opposite each other, and divided by a hollow space, in particular the patient receiving region 14. The first form 51 has a segment of a circle as a cross section perpendicular to the cylinder axis zm.

The spatial extent of the first form 51 and/or the second form 52 parallel to the cylinder axis zm is shorter than the magnet length lm according to this aspect, and/or the gradient coil unit 19 is axially symmetrical relative to a vertical which includes the cylinder axis zm.

The gradient coil unit 19 can comprise an electrical conductor 32 which connects the first conductor structure 41 to the second conductor structure 42 and to a gradient amplifier unit 28 and/or a connection unit 33. The connection unit 33 is preferably arranged peripherally at the head end of the magnet unit 17. The gradient amplifier unit 28 can comprise a gradient control unit by means of which the gradient coil unit 19 can be activated.

The magnetic resonance device 11 also has a cylindrical patient receiving region 14 for receiving an examination object 15, said patient receiving region 14 being enclosed circumferentially in the manner of a cylinder by the magnet unit 17 and the gradient coil unit 19. The examination object 15 can be pushed into the patient receiving region 14 by means of a patient support device 16 of the magnetic resonance device 11. The patient support device 16 has a patient table for this purpose, said table being mobile within the magnetic resonance device 11.

The magnetic resonance device 11 also has a radio-frequency antenna unit 20, designed in this case as a local body coil which can be positioned in a flexible manner, and a radio-frequency antenna control unit 29 for exciting a polarization which occurs in the main magnetic field 18 generated by the magnet unit 17. The radio-frequency antenna unit 20 is activated by the radio-frequency antenna control unit 29 and beams radio-frequency pulses at high frequency into an examination space that is essentially formed by the patient receiving region 14.

For the purpose of controlling the magnet unit 17, the gradient amplifier unit 28 and the radio-frequency antenna control unit 29, the magnetic resonance device 11 has a control unit 24. The control unit 24 controls the magnetic resonance device 11 centrally, for example the execution of MR control sequences. In addition, the control unit 24 comprises a reconstruction unit (not shown) for reconstruction of medical image data that is captured during the magnetic resonance examination. The magnetic resonance device 11 has a display unit 25. Control information such as control parameters, for example, and reconstructed image data can be displayed to a user on the display unit 25, for example on at least one monitor. In addition, the magnetic resonance device 11 has an input unit 26 by means of which information and/or control parameters can be entered by a user during a measuring operation. The control unit 24 can comprise the gradient amplifier unit 28 and/or radio-frequency antenna control unit 29 and/or the display unit 25 and/or the input unit 26.

The internal radius ri is typically between 22 cm and 38 cm, preferably between 25 cm and 35 cm, most preferably between 27 cm and 32 cm. The magnet length lm is typically between 70 cm and 110 cm, preferably between 80 cm and 100 cm, most preferably between 85 cm and 95 cm. The spatial extent of the first form 51 and/or the second form 52 parallel to the cylinder axis zm is typically between 35 cm and 70 cm, preferably between 40 cm and 60 cm, most preferably between 45 cm and 55 cm.

The illustrated magnetic resonance device 11 can of course comprise further components which are normally included in magnetic resonance devices 11. Moreover, the way in which a magnetic resonance device 11 generally functions is known to a person skilled in the art, and therefore a detailed description of the further components is omitted.

Figure 2:
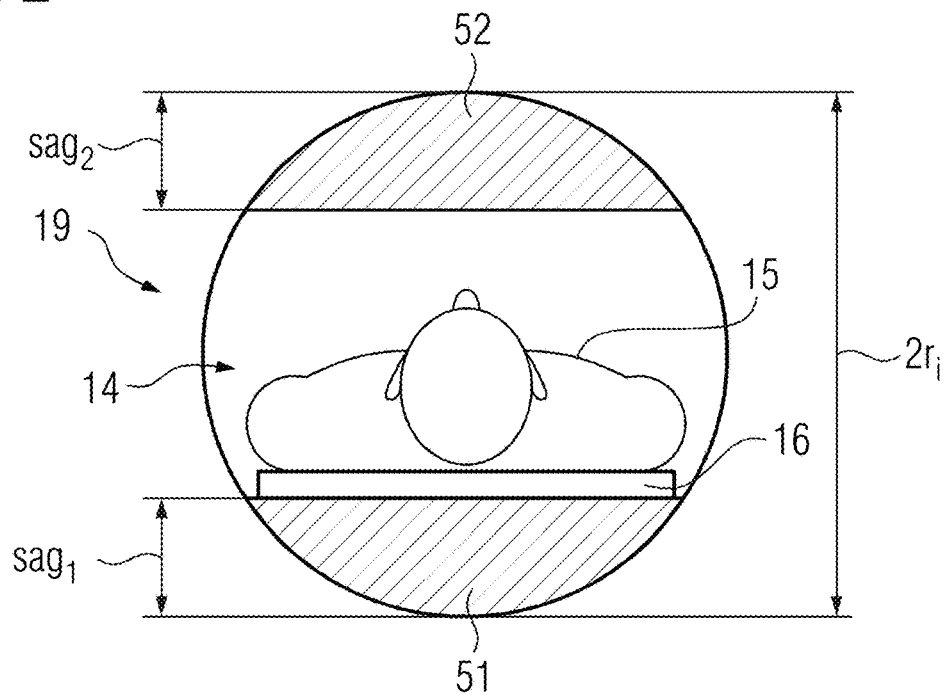
FIG. 2 shows a first aspect of a gradient coil unit according to the disclosure in a schematic illustration in a second view.

FIG. 2 shows a first aspect of a gradient coil unit 19 according to the disclosure in a schematic illustration in a second view. The second view is orthogonal to the first view, in particular perpendicular to the cylinder axis zm. The first form 51 comprising the first conductor structure 41 has, according to this aspect, a segment of a circle as a cross section perpendicular to the cylinder axis zm. The chord of the first form 51 is oriented horizontally according to this aspect, and the first form 51 is arranged below the second form 52. The second form 52 comprising the second conductor structure 42 has, according to this aspect, a segment of a circle as a cross section perpendicular to the cylinder axis zm, a contour of said cross section having an arc with the internal radius ri and a chord of said segment of a circle being oriented in a horizontal direction. The sagitta sag1 of the first form 51 perpendicular to the cylinder axis is preferably between 5 cm and 20 cm, most preferably between 10 cm and 15 cm. The sagitta sag2 of the second form 52 perpendicular to the cylinder axis is preferably between 5 cm and 20 cm, most preferably between 10 cm and 15 cm.

Figure 3:
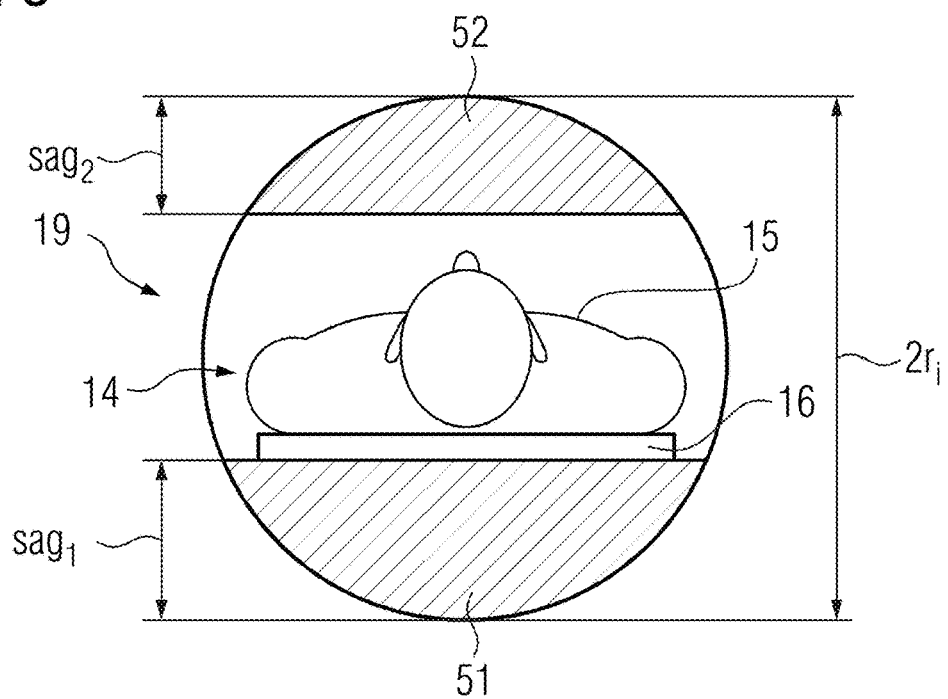
FIG. 3 shows a second aspect of a gradient coil unit according to the disclosure in a schematic illustration in a second view.

FIG. 3 shows a second aspect of a gradient coil unit 19 according to the disclosure in a schematic illustration in the second view. The second aspect of the gradient coil unit 19 according to the disclosure differs from the first aspect in that the first form 51 has a larger sagitta sag1 perpendicular to the cylinder axis than the second form 52, which has a sagitta sag2.

Figure 4:
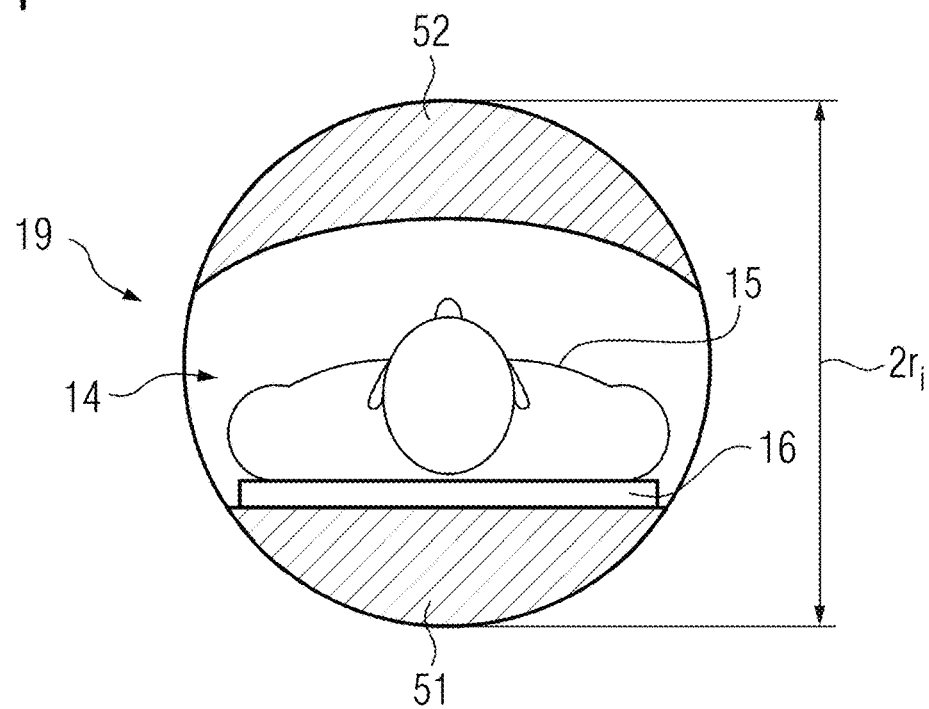
FIG. 4 shows a third aspect of a gradient coil unit according to the disclosure in a schematic illustration in a second view.

FIG. 4 shows a third aspect of a gradient coil unit 19 according to the disclosure in a schematic illustration in a second view. The third aspect of the gradient coil unit 19 according to the disclosure differs from the first aspect in that the second form 52 has a crescent-shaped cross section perpendicular to the cylinder axis.

Figure 5:
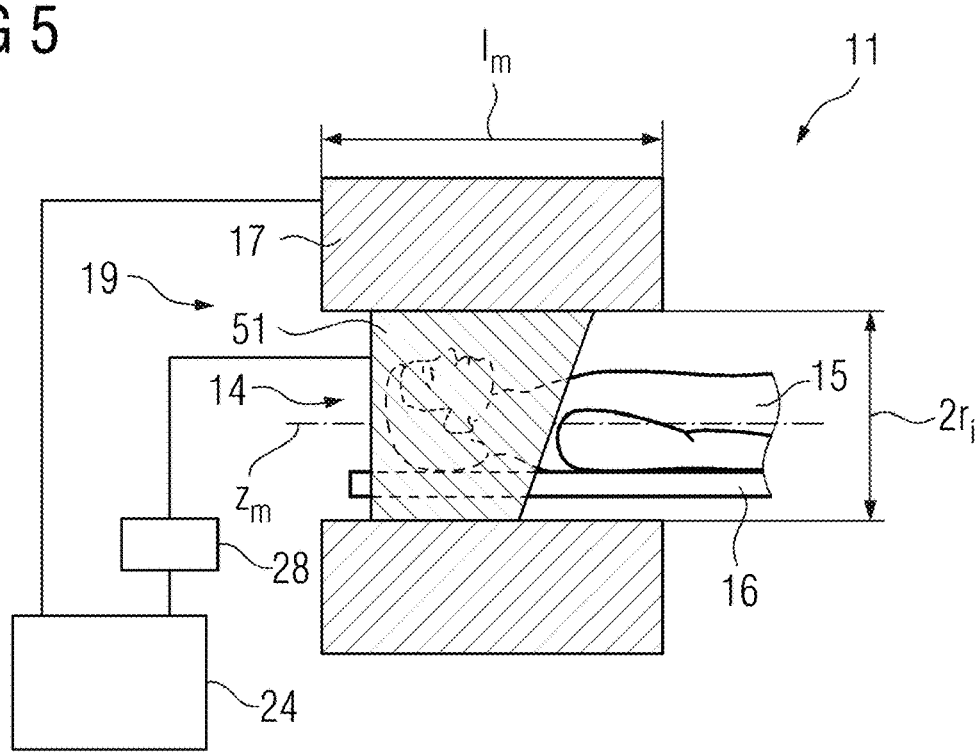
FIG. 5 shows a second aspect of a magnetic resonance device according to the disclosure in a schematic illustration in a first view.

FIG. 5 shows a second aspect of a magnetic resonance device 11 according to the disclosure in a schematic illustration in a first view. The second aspect of the magnetic resonance device 11 according to the disclosure preferably differs from the first aspect in terms of size, in particular in respect of the internal radius ri and/or the magnet length lm and/or the patient receiving region 14. The patient receiving region 14 is preferably designed to receive the head region of the examination object 15 instead of the whole body of the examination object 15. The internal radius ri, which in particular also indirectly defines the patient receiving region 14, is typically smaller than in the first aspect. In particular, the patient receiving region 14 is preferably designed to receive the head of the examination object 15 instead of the whole body thereof.

The internal radius ri of the second aspect of the magnetic resonance device 11 according to the disclosure is typically between 18 cm and 35 cm, preferably between 20 cm and 31 cm, most preferably between 22 cm and 28 cm. The magnet length lm is typically between 40 cm and 90 cm, preferably between 50 cm and 80 cm, most preferably between 60 cm and 70 cm. The spatial extent of the first form 51 and/or the second form 52 parallel to the cylinder axis zm is typically between 30 cm and 60 cm, preferably between 40 cm and 50 cm, most preferably between 42 cm and 48 cm.

The second aspect of the magnetic resonance device 11 according to the disclosure differs from the first aspect in respect of the gradient coil unit 19 comprised therein. The first form 51 included in the gradient coil unit 19 and comprising the first conductor structure 41 has, according to this aspect, a segment of a circle as a cross section perpendicular to the cylinder axis zm. The chord of the first form 51 is oriented vertically according to this aspect.

The second form 52 included in the gradient coil unit 19 and comprising the second conductor structure 42 has, according to this aspect, a segment of a circle as a cross section perpendicular to the cylinder axis zm. The chord of the second form 52 is oriented vertically according to this aspect. According to this aspect, a contour of the cross section of the first form 51 and the second form 52 includes an arc with the internal radius ri.

The first form 51 preferably has a longer upper edge than lower edge parallel to the cylinder axis. In particular, a projection of the first form 51 in a plane parallel to the cylinder axis can represent a trapezoid, in particular a right-angled trapezoid. The second aspect of the magnetic resonance device 11 according to the disclosure also has further features as illustrated in FIG. 1, for example a radio-frequency antenna unit 20 and further components which are relevant to the way in which a magnetic resonance device 11 functions and are generally known to a person skilled in the art. For the sake of clarity, a detailed description and illustration of the further components has been omitted here.

Figure 6:
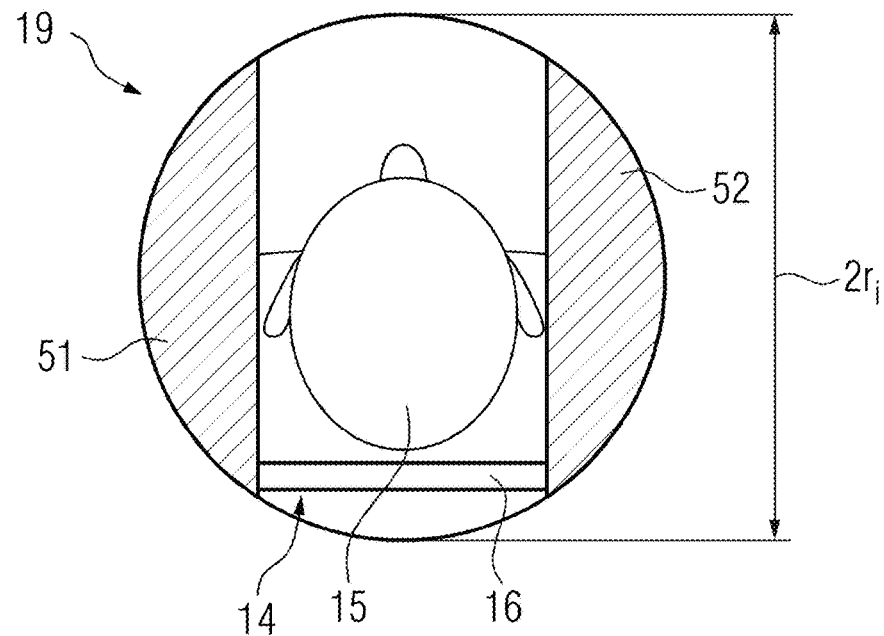
FIG. 6 shows a fourth aspect of a gradient coil unit according to the disclosure in a schematic illustration in a second view.

FIG. 6 shows a fourth aspect of a gradient coil unit 19 according to the disclosure in a schematic illustration in a second view. The fourth aspect of the gradient coil unit 19 according to the disclosure differs from the first aspect in that the chord of the first form 51 and the chord of the second form 52 are oriented vertically. FIG. 5 can represent the fourth aspect of the gradient coil unit 19 according to the disclosure in a first view. The fourth aspect of the gradient coil unit 19 according to the disclosure can however also be configured such that a projection of the first form 51 in a plane parallel to the cylinder axis represents a rectangle.

Figure 7:
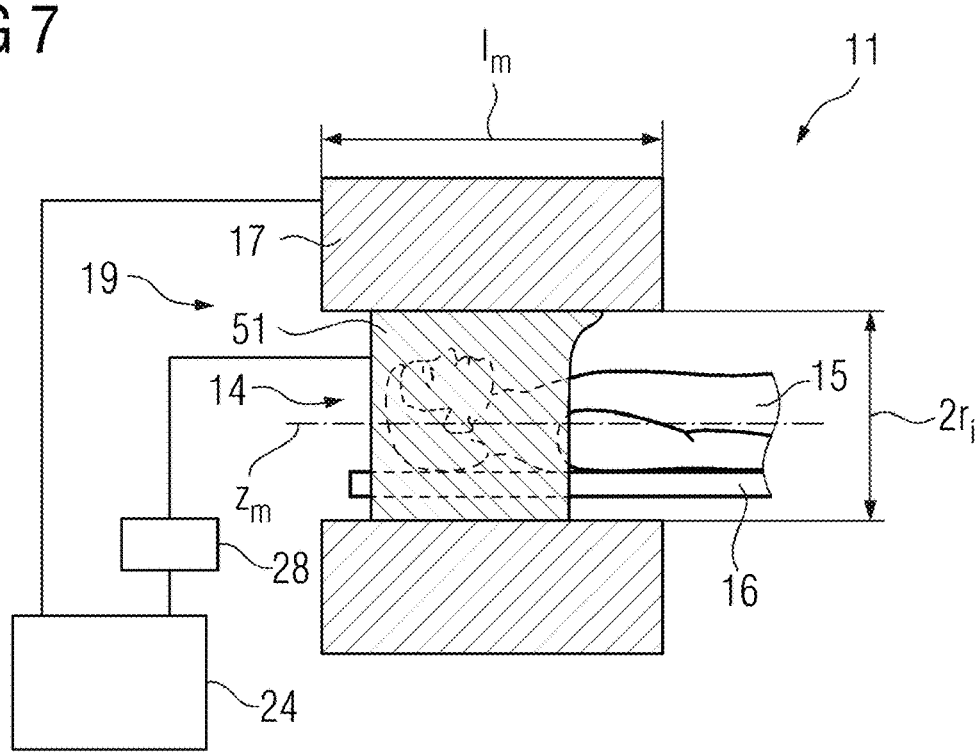
FIG. 7 shows a third aspect of a magnetic resonance device according to the disclosure in a schematic illustration in a first view.

FIG. 7 shows a third aspect of a magnetic resonance device 11 according to the disclosure in a schematic illustration in a first view. The third aspect differs typically from the second aspect of the magnetic resonance device 11 in that a projection of the first form 51 in a plane parallel to the cylinder axis zm, in particular in a vertical plane, has a curvature on at least one side between upper edge and lower edge, the upper edge preferably being longer than the lower edge. Likewise, a projection of the second form 52 in a plane parallel to the cylinder axis zm, in particular in a vertical plane, has a curvature on at least one side between upper edge and lower edge, the upper edge preferably being longer than the lower edge.

Figure 8:
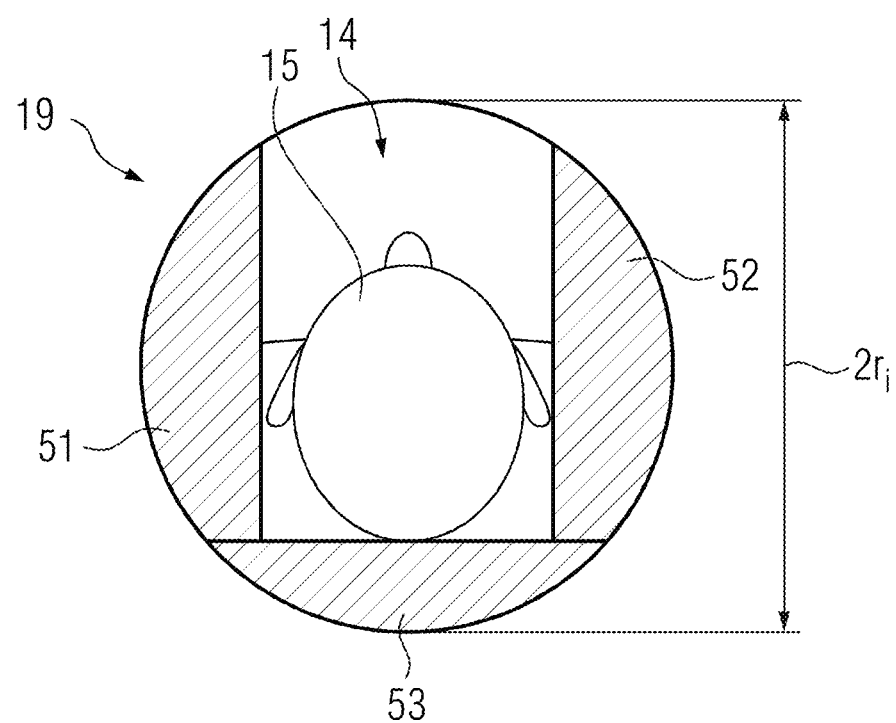
FIG. 8 shows a fifth aspect of a gradient coil unit according to the disclosure in a schematic illustration in a second view.

FIG. 8 shows a fifth aspect of a gradient coil unit 19 according to the disclosure in a schematic illustration in a second view. The fifth aspect of the gradient coil unit 19 preferably differs from the fourth aspect in that it comprises a third conductor structure 43 arranged within a third form 53.

The first conductor structure 41, the second conductor structure 42 and the third conductor structure 43 are designed together to generate a magnetic field gradient in a first direction. The third form 53 has a segment of a circle as a cross section perpendicular to the cylinder axis zm, with a chord in a horizontal direction. The contour of the segment of a circle preferably comprises an arc with an internal radius ri. An overlap of the third form 53 with the first form 51 and/or the second form 52 may be present, any overlap region preferably comprising less than 20%, most preferably less than 10% of the third form 53.

Although the disclosure is illustrated and described in detail above with reference to the preferred exemplary aspects, the disclosure is not restricted by the examples disclosed and other variations may be derived therefrom by a person skilled in the art without departing from the scope of the disclosure.

The invention claimed is:

1. A gradient coil unit configured to fit into a hollow cylindrical magnet unit having an internal radius and a magnet length along a cylinder axis of a magnetic resonance device, comprising:

a first conductor structure arranged within a first form; and a second conductor structure arranged within a second form, wherein the first conductor structure and the second conductor structure are designed together to generate a magnetic field gradient in a first direction, wherein the first form and the second form are arranged separately, opposite each other, and divided by a hollow space, wherein the first form has a segment of a circle as a cross section perpendicular to the cylinder axis, and wherein a chord of the first form is oriented horizontally and the first form is arranged below the second form, and the first form has a larger sagitta perpendicular to the cylinder axis than the second form.

2. The gradient coil unit of claim 1, wherein a contour of a cross section of the second form perpendicular to the cylinder axis includes an arc which has the internal radius.

3. The gradient coil unit of claim 1, wherein a chord of the first form is oriented horizontally and the first form is arranged below the second form.

4. The gradient coil unit of claim 1, wherein the second form has a crescent-shaped cross section perpendicular to the cylinder axis.

5. The gradient coil unit of claim 1, wherein a chord of the first form is oriented vertically, and the second form has a segment of a circle as a cross section perpendicular to the cylinder axis, with a chord in a vertical direction.

6. The gradient coil unit of claim 5, wherein a projection of the first form in a plane parallel to the cylinder axis is a trapezoid.

7. The gradient coil unit of claim 5, wherein a projection of the first form in a plane parallel to the cylinder axis has a curvature on at least one side between upper edge and lower edge.

8. The gradient coil unit of claim 1, wherein a spatial extent of the first form and/or the second form parallel to the cylinder axis is shorter than the magnet length.

9. The gradient coil unit of claim 1, wherein the gradient coil unit is axially symmetrical relative to a vertical which includes the cylinder axis.

10. A magnetic resonance device comprising:
a hollow cylindrical magnet unit having an internal radius and a magnet length along the cylinder axis and a gradient coil unit of claim 1,
wherein the gradient coil unit is arranged within the internal radius of the magnet unit.

11. A gradient coil unit configured to fit into a hollow cylindrical magnet unit having an internal radius and a magnet length along a cylinder axis of a magnetic resonance device, comprising:
a first conductor structure, arranged within a first form; and
a second conductor structure arranged within a second form,
wherein the first conductor structure and the second conductor structure are designed together to generate a magnetic field gradient in a first direction,
wherein the first form and the second form are arranged separately, opposite each other, and divided by a hollow space,
wherein a chord of the first form is oriented vertically, and the second form has a segment a circle as a cross section perpendicular to the cylinder axis, with a chord in a vertical direction, and
wherein the first form has a segment of a circle as a cross section perpendicular to the cylinder axis, and the first form has a longer upper edge than lower edge parallel to the cylinder axis.

12. A gradient coil unit configured to fit into a hollow cylindrical magnet unit having an internal radius and a magnet length along a cylinder axis of a magnetic resonance device, comprising:
a first conductor structure arranged within a first form;
a second conductor structure arranged within a second form,
wherein the first conductor structure and the second conductor structure are designed together to generate a magnetic field gradient in a first direction,
wherein the first form and the second form are arranged separately, opposite each other, and divided by a hollow space,
wherein a chord of the first form is oriented vertically, and the second form has a segment a circle as a cross section perpendicular to the cylinder axis, with a chord in a vertical direction, and
wherein the first form has a segment of a circle as a cross section perpendicular to the cylinder axis; and
a third conductor structure arranged within a third form,
wherein the first conductor structure, the second conductor structure, and the third conductor structure are designed together to generate a magnetic field gradient in a first direction, and the third form has a segment of a circle as a cross section perpendicular to the cylinder axis, with a chord in a horizontal direction.

* * * * *